United States Patent [19]

Motai et al.

[11] Patent Number: 5,045,905
[45] Date of Patent: Sep. 3, 1991

[54] AMORPHOUS SILICON THIN FILM TRANSISTOR

[75] Inventors: Noboru Motai; Yoshihisa Ogiwara, both of Tochigi; Yasunari Kanda, Tokyo, all of Japan

[73] Assignees: Nippon Precision Circuits Ltd.; Seikosha Co., Ltd., both of Tokyo, Japan

[21] Appl. No.: 626,375

[22] Filed: Dec. 12, 1990

Related U.S. Application Data

[60] Continuation of Ser. No. 422,475, Oct. 17, 1989, abandoned, which is a division of Ser. No. 322,842, Mar. 13, 1989, Pat. No. 4,916,090.

[30] Foreign Application Priority Data

Mar. 23, 1988 [JP] Japan ................... 63-68697

[51] Int. Cl.⁵ ............................................. H01L 29/78
[52] U.S. Cl. .................................. 357/23.7; 357/2; 357/4; 357/61; 357/91
[58] Field of Search ............... 357/23.7, 2, 61, 91, 357/4

[56] References Cited

U.S. PATENT DOCUMENTS

| 4,169,740 | 10/1979 | Kalbitzer et al. | 357/2 |
| 4,459,739 | 7/1984 | Shepherd et al. | 357/23.7 |
| 4,720,736 | 1/1988 | Takafuji et al. | 357/23.7 |
| 4,741,964 | 5/1988 | Haller | 357/2 |

FOREIGN PATENT DOCUMENTS

| 59-172774 | 9/1984 | Japan | 357/2 |
| 60-105275 | 6/1985 | Japan | 357/23.7 |
| 60-198865 | 10/1985 | Japan | 357/2 |
| 61-87371 | 5/1986 | Japan | 357/2 |

Primary Examiner—Rolf Hille
Assistant Examiner—Steven Loke
Attorney, Agent, or Firm—Jordan and Hamburg

[57] ABSTRACT

An amorphous silicon thin film transistor includes a gate electrode, an amorphous silicon layer on the gate insulating layer, a drain electrode and a source electrode on the amorphous silicon layer such that a portion of the side of the amorphous silicon layer which faces away from the gate electrode is exposed, and an impurity layer for reducing an off current of the transistor, the impurity layer including an impurity forming an acceptor and which is formed on the exposed portion of the amorphous silicon layer, the amorphous silicon layer being of a first conduction type and the acceptor being of a second different conduction type.

7 Claims, 4 Drawing Sheets

AMORPHOUS SILICON THIN FILM TRANSISTOR

This application is a continuation of application Ser. No. 422,475, filed Oct. 17, 1989, now abandoned, being a divisional application of Ser. No. 322,842 filed Mar. 13, 1989, now U.S. Pat. No. 4,916,090 issued Apr. 10, 1990.

FIELD OF THE INVENTION

The present invention relates to a method of manufacturing an amorphous silicon (hereinafter referred to as a-Si) thin film transistor (hereinafter referred to as TFT).

BACKGROUND OF THE INVENTION

Research and development has been conducted for producing an a-SiTFT for use in active matrix type liquid crystal display devices, etc.

FIG. 5 is a cross sectional view illustrating an a-SiTFT. This Figure shows the insulation substrate 1, gate electrode 2, gate insulation layer 3, amorphous silicon layer 4, n-type silicon layer 5 containing an appropriate amount of phosphor, source electrode 6, drain electrode 7, source wiring 8, pixel electrode 9, protection insulation layer 10, light shielding layer 11 and orientation film 12. A TFT having a structure as shown in the Figure in which the gate electrode 2, the source electrode 6 and the drain electrode 7 are opposed while the gate insulation layer 3 and the amorphous silicon layer 4 are between the gate electrode and the source and drain electrodes, and the gate electrode 2 is formed on the side of the insulation substrate 1 remote from the source electrode 6 and the drain electrode 7, is referred to as an inverted stagger type TFT.

FIGS. 6(a) and (b) show a static characteristic of the inverted stagger type a-SiTFT. In FIG. 6(a), the abscissa represents a gate voltage $V_g$ and the ordinate represents a drain current $I_d$. FIG. 6(b) shows a measuring circuit in which the source-drain voltage $V_{ds} = 7.5$ (volts) is made constant and the voltage $V_b$ applied to the light shielding layer is set to $V_b = 0$ (volts) or $-10$ (volts). As can be seen from FIG. 6(a), the drain current $I_d$ rises from the vicinity of $V_g = 0$ (volts) when $V_b = -10$ (volts), whereas the drain current $I_d$ rises from the vicinity of $V_g = -15$ (volts) when $V_b = 0$ (volts) and, accordingly, the two characteristics are apparently different.

FIG. 7 shows the reason for such a difference in the characteristics. Electric current flowing through a TFT usually comprises a current flowing along the interface between the gate insulation layer 3 and the amorphous silicon layer 4, that is, a current flowing through the path A as shown in FIG. 7. However, in a TFT, a current path shown by B in FIG. 7 is also present along the interface between the protection insulation layer 10 and the amorphous silicon layer 4 in the TFT.

Accordingly, in the characteristic shown in FIG. 6(a), the current path B is interrupted when $V_b = -10$ (volts), whereas the current path B is not interrupted when $V_b = 0$ (volts) to provide the characteristic as shown in FIG. 6(a). That is, the current that rises from the vicinity of $V_g = -15$ (volts) when $V_b = 0$ (volts) is derived from the current path B.

Since no voltage is applied to the light shielding layer in the usual state of use, the static characteristic of the TFT is the same as the characteristic when $V_b = 0$ (volts). Such a characteristic results in the increase of the OFF current of the TFT. This result is disadvantageous in the use of the TFT.

SUMMARY OF THE INVENTION

The present invention has been made in view of the above-described problems and it is an object thereof to reduce the OFF current in a TFT.

DESCRIPTION OF THE PREFERRED EMBODIMENTS

An embodiment of the present invention will now be explained with reference to the drawings.

Figure 1:
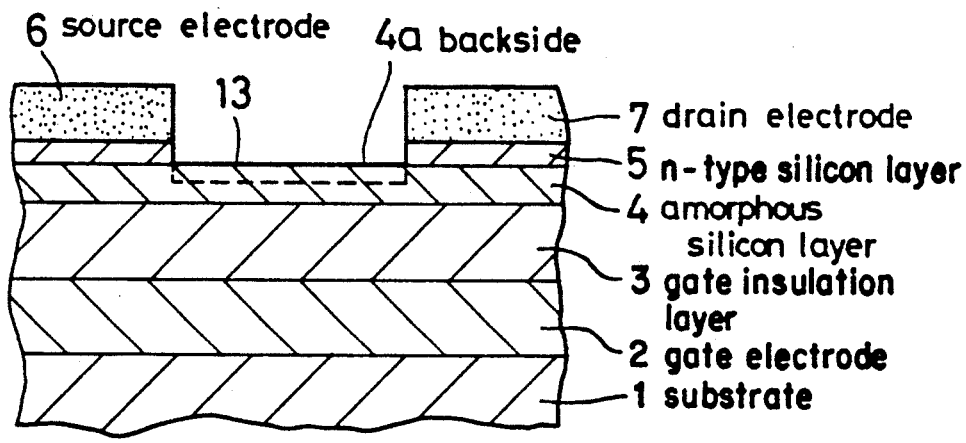
FIG. 1 is a cross sectional view of an amorphous silicon thin film transistor manufactured by the manufacturing method in accordance with one embodiment of the present invention.

FIG. 1 shows an insulation substrate 1 made of glass, etc., gate electrode 2, gate insulation layer 3, amorphous silicon layer 4, n-type silicon layer 5, source electrode 6, drain electrode 7, impurity layer 13 containing an impurity forming an acceptor for the amorphous silicon layer 4, and a gas phase atmosphere 14 having a gas containing an impurity forming the acceptor.

In this embodiment, as shown in this Figure, the amorphous silicon layer 4 is exposed on the side 4a thereof away from the gate electrode to the gas phase atmosphere 14, and the gas contains an impurity forming an acceptor for the amorphous silicon layer. The impurity is activated by means of an electric field or light energy, thereby doping the impurity from the side 4a of the amorphous silicon layer 4 into the amorphous silicon layer. A hydrogen compound is preferred for the gas containing the impurity forming the acceptor, and $B_2H_6$ (diborane), etc. can be used for this purpose. Specifically, $H_2$ is further added and the gas is decomposed by plasma to thereby activate the B (boron) and dope the amorphous silicon layer.

Figure 2:
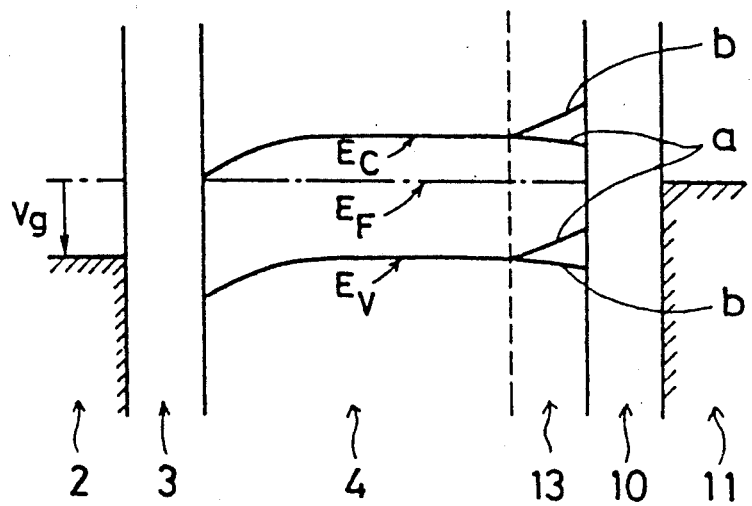
FIG. 2 is an explanatory view showing the energy band before and after doping the impurity.

FIG. 2 shows an energy band before and after impurity doping the TFT. The drawing shows gate electrode 2, gate insulation layer 3, and amorphous silicon layer 4, as well as protection insulation layer 10, light shielding layer 11 and impurity layer 13 of the completed TFT. Before doping with the impurity, the amorphous silicon layer at the interface between the amorphous silicon layer 4 and the protection insulation layer is an n-type, and the conduction band lower end Ec and the valence band upper end Ev extend downward as indicated at a (FIG. 2). Therefore, the conduction band lower end Ec approaches the Fermi level Ef and forms an electric path at the interface for movable electrons. On the other hand, after doping with the impurity, the amorphous silicon layer at the interface is a p-type, in which the conduction band lower end Ec and the valence band upper end Ev extend upward as indicated at b (FIG. 2). Accordingly, there is no longer a current path for movable electrons.

Figure 3A:
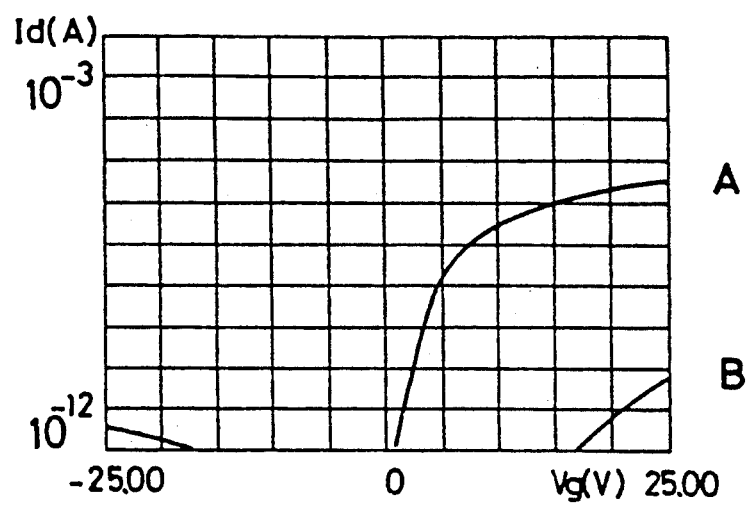
FIGS. 3(a) and (b) are a characteristic chart and diagrams showing the static characteristic for the structure shown in FIG. 1.
Figure 3B:
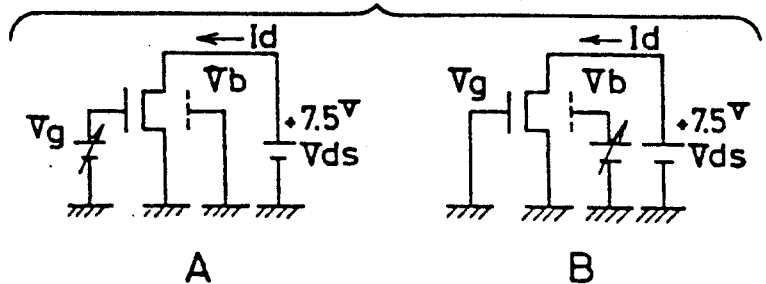

FIG. 3(a) shows the static characteristic of an a-SiTFT when the a-SiTFT is formed by the manufacturing method as described above. FIG. 3(b) shows the measuring circuit thereof. The characteristic A shown in FIG. 3(a) is measured by the measuring circuit A in FIG. 3(b). That is, it indicates the drain current Id when the gate voltage Vg is changed from $-25$ (volts) to 25 (volts) while setting the voltage of the light shielding layer to Vb=0 (volts). The drain current Id rises from the vicinity of 0 (volts) and the previously-observed current that rises from the vicinity of $-15$ (volts) is so far eliminated. The characteristic B is obtained by the measurement of the measuring circuit B in FIG. 3(b). That is, the drain current is measured when Vb is changed from $-25$ (volts) to 25 (volts) while setting the gate voltage to Vg=0 (volts). It can be said that this graph shows the characteristic of the current path formed along the interface between the amorphous silicon layer and the protection insulation layer. As can be seen from the Figure, the current rises from the vicinity of Vb=17 (volts).

From the foregoing description, it can be seen in an a-SiTFT formed by using the manufacturing method as described above that, since the impurity forming an acceptor is doped on the side of the amorphous silicon layer away from the gate, this side of the amorphous silicon layer is formed into a p-type and the current path formed at the interface between the amorphous silicon layer and the protection insulation layer is not formed unless a positive voltage of a certain level is applied to the light shielding layer. Accordingly, it is possible to completely eliminate the increase in the OFF current caused by the current flowing through the current path formed along the interface between the amorphous silicon layer and the protection insulation layer observed so far.

Figure 4:
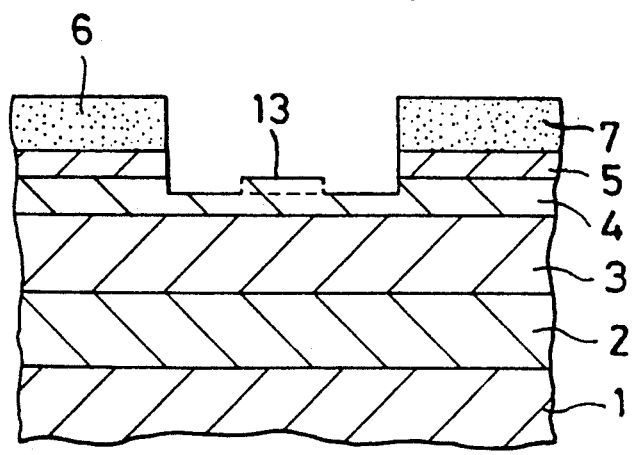
FIG. 4 is a cross sectional view illustrating an amorphous silicon thin film transistor manufactured by an alternate manufacturing method according to the present invention.
Figure 5:
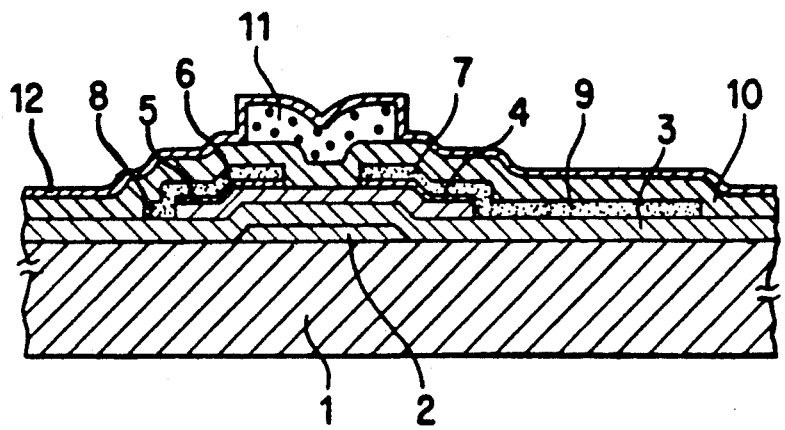
FIG. 5 is a cross sectional view illustrating a conventional amorphous silicon thin film transistor.
Figure 6A:
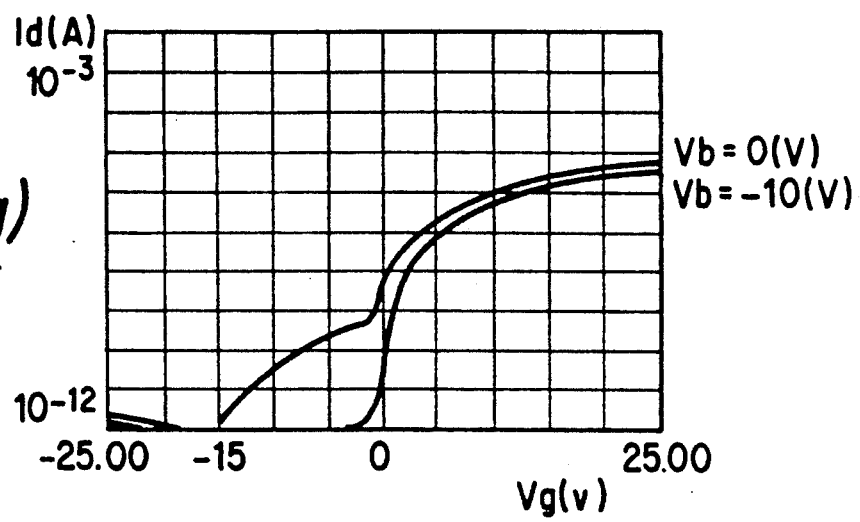
FIGS. 6(a) and (b) are a characteristic chart and a diagram showing the static characteristic in a conventional embodiment.
Figure 6B:
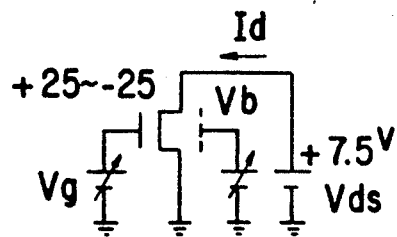
Figure 7:
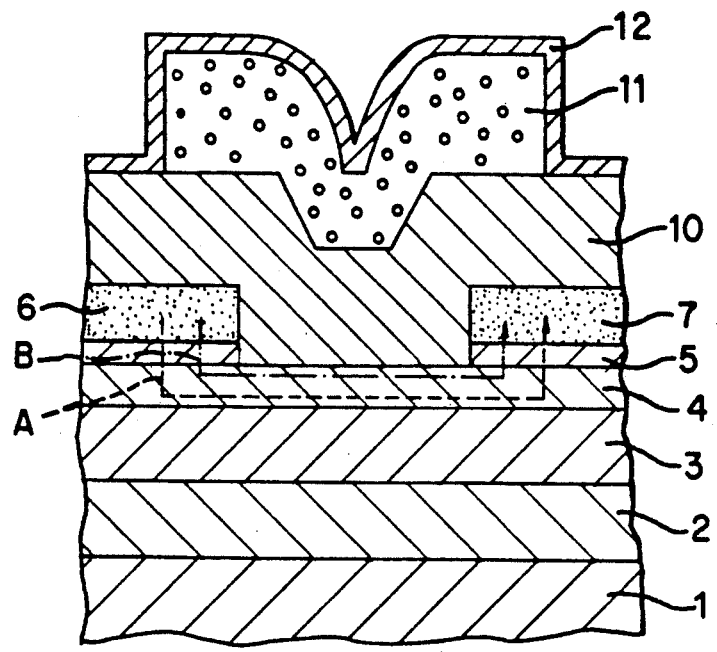
FIG. 7 is a cross sectional view showing the current path in the amorphous silicon thin film transistor shown in FIG. 5.

FIG. 4 shows another embodiment of the present invention. After forming the impurity in the same manner as in the foregoing embodiment, the impurity layer 13 is left only at the central portion of the a-SiTFT. Since the amorphous silicon layer 4 at the interface is formed into a p-type at the position where the impurity layer 13 is present, the current path is interrupted at that position, so that the same effect as that in the foregoing embodiment can be obtained.

When using the a-SiTFT as an active matrix type liquid crystal display device, an ITO layer forming a pixel electrode may sometimes be exposed to the surface upon doping the impurity. In such a case, it is preferred that the gas phase atmosphere is comprised of a gas containing the impurity forming the acceptor and an oxidizing gas, for example, $N_2O$, $CO_2$, etc. in order not to reduce the ITO layer.

According to the present invention, since the impurity forming the acceptor is activated by means of an electric field or light energy and the impurity is doped from the side of the amorphous silicon layer away from the gate, this side of the amorphous silicon layer is formed into a p-type and no electric current path is formed along the interface between the amorphous silicon layer and the protection insulation layer. Accordingly, the increase in the OFF current caused by the current path can be completely eliminated to greatly contribute to the improvement of the characteristic of the amorphous silicon thin film transistor.

What is claimed is:

1. An amorphous silicon thin film transistor comprising:
   a gate electrode on an insulating substrate,
   a gate insulating layer on said gate electrode and on said insulating substrate,
   an amorphous silicon layer on said gate insulating layer,
   first and second spaced apart n-type silicon layers formed directly on said amorphous silicon layer, said n-type silicon layers forming a source and a drain of said transistor, each of said n-type silicon layers having an edge that faces the other n-type silicon layer, and
   an impurity layer for reducing an off current of said transistor, said impurity layer including a p-type impurity and being formed directly on said amorphous silicon layer only in a region thereof between said edges.

2. An amorphous thin film transistor as defined in claim 1, wherein said impurity layer is continuously formed from one of said edges to the other of said edges.

3. An amorphous silicon thin film transistor as defined in claim 1 wherein said impurity layer is formed at a center area between said edges.

4. An amorphous silicon thin film transistor comprising:
   an insulating substrate,
   a gate electrode on said insulating substrate,
   a gate insulating layer on the gate electrode and substrate,
   an amorphous silicon layer on said gate insulating layer,
   first and second spaced apart protective silicon layers formed directly on said amorphous silicon layer such that a portion of a side of said amorphous silicon layer which faces away from said gate electrode is exposed,
   a drain electrode and a source electrode on said protective silicon layers such that said portion of the side of said amorphous silicon layer remains exposed, and
   an impurity layer for reducing an off current of said transistor, said impurity layer including an impurity forming an acceptor and being formed directly on said exposed portion of the amorphous silicon layer between said first and second spaced apart protective silicon layers, the amorphous silicon layer being of a first conduction type and the impurity layer being of a second different conduction type.

5. An amorphous silicon thin film transistor as defined in claim 4, wherein said impurity layer is formed on only a portion of the exposed portion of the side of said amorphous silicon layer.

6. An amorphous silicon thin film transistor as defined in claim 4, wherein said impurity layer is formed at a center area of the exposed portion of the side of said amorphous silicon layer.

7. An amorphous silicon thin film transistor as defined in claim 4, wherein said amorphous silicon layer is of n-type, and said impurity layer is of a p-type.

* * * * *